United States Patent
Lee (10) Patent No.: US 7,112,882 B2
(45) Date of Patent: Sep. 26, 2006

(54) STRUCTURES AND METHODS FOR HEAT DISSIPATION OF SEMICONDUCTOR INTEGRATED CIRCUITS

(75) Inventor: Hsin-Hui Lee, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/925,612

(22) Filed: Aug. 25, 2004

(65) Prior Publication Data

US 2006/0043576 A1   Mar. 2, 2006

(51) Int. Cl.
*H01L 23/10* (2006.01)
*H01L 23/34* (2006.01)

(52) U.S. Cl. ............ 257/706; 257/722; 257/778; 257/787; 257/789; 257/795; 438/33; 438/68; 438/113; 438/114; 438/460

(58) Field of Classification Search ........... 257/706, 257/722, 778, 787, 789, 795; 438/33, 68, 438/113, 114, 460
See application file for complete search history.

(56) References Cited

U.S. PATENT DOCUMENTS

| | | | | | |
|---|---|---|---|---|---|
| 3,648,131 | A | * | 3/1972 | Stuby | 257/622 |
| 3,761,782 | A | * | 9/1973 | Youmans | 257/778 |
| 3,787,252 | A | * | 1/1974 | Filippazzi et al. | 438/492 |
| 4,842,699 | A | * | 6/1989 | Hua et al. | 205/126 |
| 5,158,911 | A | * | 10/1992 | Quentin | 438/125 |
| 5,229,647 | A | * | 7/1993 | Gnadinger | 257/785 |
| 5,319,237 | A | * | 6/1994 | Legros | 257/522 |
| 5,378,926 | A | * | 1/1995 | Chi et al. | 257/767 |
| 5,532,506 | A | * | 7/1996 | Tserng | 257/276 |
| 5,793,117 | A | * | 8/1998 | Shimada et al. | 257/780 |
| 5,949,140 | A | * | 9/1999 | Nishi et al. | 257/728 |
| 6,075,712 | A | * | 6/2000 | McMahon | 361/783 |
| 6,160,308 | A | * | 12/2000 | Aoki | 257/678 |
| 6,175,160 | B1 | * | 1/2001 | Paniccia et al. | 257/778 |
| 6,188,138 | B1 | * | 2/2001 | Bodo et al. | 257/778 |
| 6,423,559 | B1 | * | 7/2002 | Ikeya et al. | 438/17 |
| 6,459,150 | B1 | * | 10/2002 | Wu et al. | 257/724 |
| 6,597,066 | B1 | * | 7/2003 | Farnworth et al. | 257/723 |
| 6,768,195 | B1 | * | 7/2004 | Drost | 257/723 |
| 2003/0146520 | A1 | | 8/2003 | Fang | |
| 2004/0070058 | A1 | | 4/2004 | Joshi et al. | |

FOREIGN PATENT DOCUMENTS

TW         29112        4/2003

* cited by examiner

Primary Examiner—Jasmine Clark
(74) Attorney, Agent, or Firm—Duane Morris LLP (57) ABSTRACT

Structures and methods for semiconductor integrated circuits with respect to heat dissipation are provided. The structure comprises a die having a first surface and a second surface. The first surface has an opening in it, and the second surface has a contact pad formed on it. The first surface is opposite to the second surface. A conductive layer is formed over the first surface, covering a surface of the opening.

21 Claims, 11 Drawing Sheets (PRIOR ART)
FIG. 1

FIG. 4A

STRUCTURES AND METHODS FOR HEAT DISSIPATION OF SEMICONDUCTOR INTEGRATED CIRCUITS

FIELD OF THE INVENTION

The present invention relates to the fabrication of packages of integrated circuits and, more particularly relates to structures and methods for heat dissipation of semiconductor integrated circuits.

BACKGROUND OF THE INVENTION

The Complementary Metal Oxide Semiconductor (CMOS) technology has been recognized as the leading technology for use in digital electronics in general and for use in many computer products in particular. The miniaturization of CMOS technology according to a scaling rule is used in a semiconductor device to achieve large-scale integration and high-speed operation. Due to its high integration, heat generated while integrated circuits operate tremendously soars. In order to dissipate heat generated therefrom, packaging methods or structures have been widely proposed to resolve the problem.

Figure 1:
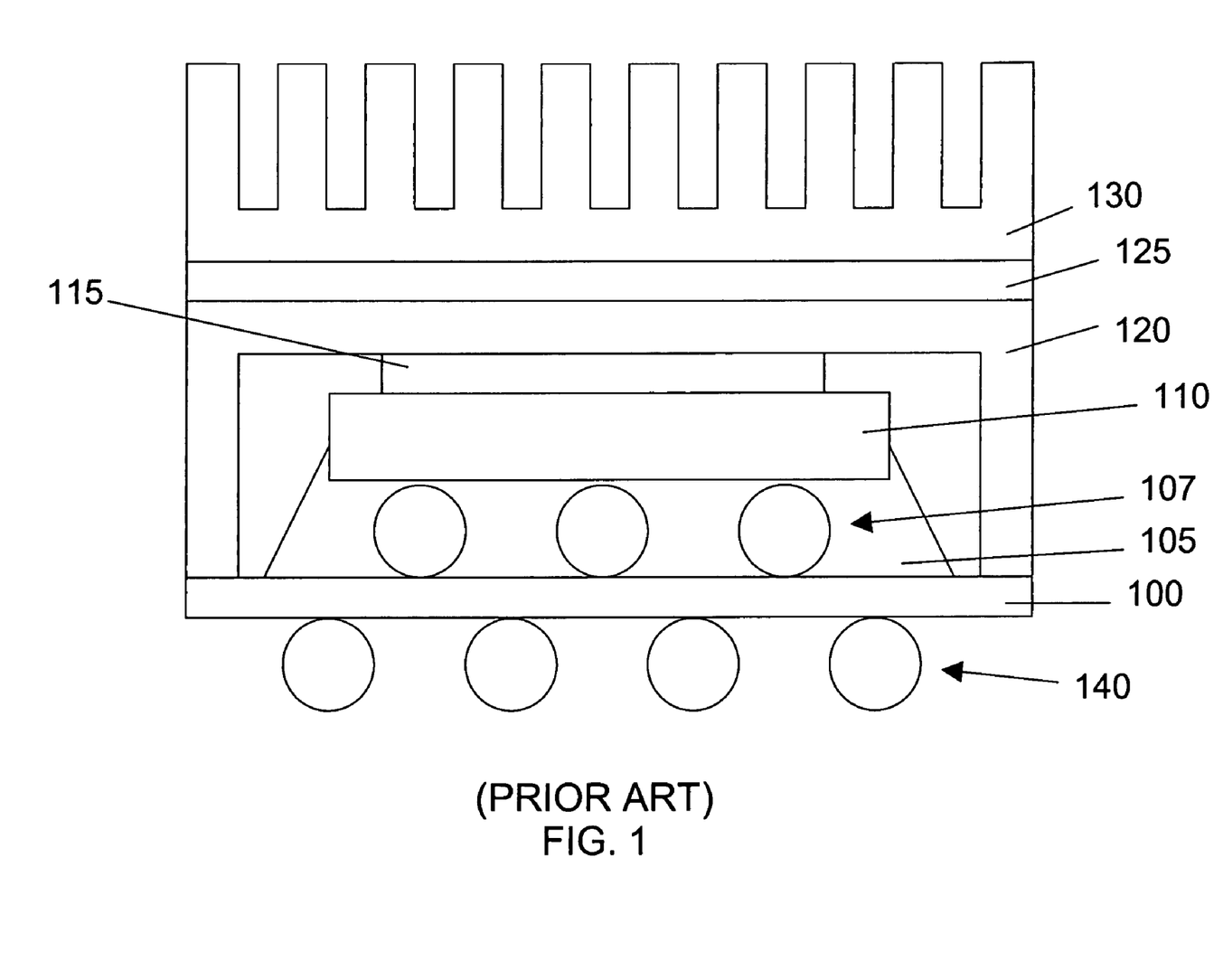
FIG. 1 is a cross sectional view showing a prior art package structure for heat dissipation.

FIG. 1 is a cross sectional view showing a prior art package structure for heat dissipation.

The prior art structure comprises a package substrate 100. Solder balls 140 are formed under the package substrate 100. A die 110 is flip-chip mounted to the package substrate 100. Solder balls 107 mechanically and electrically connects the die 110 with the package substrate 100. An under-fill 105 is formed between the die 110 and the package substrate 100. A heat spreader 120 covers the die 110. A thermal interface material, such as a conductive epoxy layer 115, is formed on the die 110. An adhesive layer 125 is applied on the heat spreader 120 so as to adhere the heat sink 130 to the heat spreader 120.

Heat which is generated on the surface of the die 110 due to the operation of integrated circuits is first conductively dispersed across the length and width of the package by the heat spreader 120, using heat conduction, to eliminate hot spots. The heat can be transmitted to the heat sink 130 through the conductive epoxy layer 115, the heat spreader 120 and the adhesive layer 125. The heat sink has a plurality of fins, to provide a large surface area suitable for dissipating heat into the ambient air by convection.

Due to the significant differences of the thermal expansion properties among the package substrate 100, the die 110, the conductive epoxy layer 115, the heat spreader 120, the adhesive layer 125 and the heat sink 130, delamination can occur at the interfaces between the package substrate 100 and the die 110, between the die 110 and the conductive epoxy layer 115, between the conductive epoxy layer 115 and the heat spreader 120, between the heat spreader 120 and the adhesive layer 125 and/or between the adhesive layer 125 and the heat sink 130. Delamination causes the package structure to fail, so as to reduce the packaging yield. For this reason, it is often necessary to include an underfill 105 to relieve the stresses caused by differential thermal expansion during thermal cycling.

U.S. patent application Ser. No. 2004/0070058 A1 discloses an integrated circuit package design. The packaged integrated circuit includes a package substrate having electrical contacts for receiving an integrated circuit. The integrated circuit is electrically connected to the electrical contacts of the package substrate. A stiffener is mounted to the package substrate, where the stiffener has a non-orthogonal cut out in which the integrated circuit is disposed. The edges of the cut out are disposed at no greater a distance from the corners of the integrated circuit than they are from the sides of the integrated circuit.

U.S. patent application Ser. No. 2003/0146520 A1 discloses a flip-chip package with a heat spreader. The package includes a substrate, a chip, a heat spreader, multiple first bumps, multiple second bumps, a first fill material and a second fill material. The substrate has multiple conductive nodes formed on a surface thereof. The chip has an active surface and a corresponding backside surface. The chip further has multiple conductive pads formed on the active surface. The chip is placed over the substrate, and the active surface of the chip faces the surface of the substrate. The heat spreader having a cavity is placed on the substrate, wherein the cavity of the heat spreader faces the substrate and the chip is located inside the cavity. The first bumps are placed between the conductive pads of the chip and the conductive nodes of the substrate. The second bumps are placed between the backside surface of the chip and the heat spreader. The first fill material is filled between the chip and the substrate and covers the first bumps. The second fill material is filled in the cavity of the heat spreader and covers the chip and the second bumps.

Improved heat dissipation methods and structures for die packages are desired.

SUMMARY OF THE INVENTION

A structure for heat dissipation comprises a die having a first surface and a second surface. The first surface comprises at least one opening therein, and the second surface comprises a contact pad formed thereon. The first surface is opposite to the second surface. A conductive layer is formed over the first surface, covering a surface of the opening.

Another structure for heat dissipation comprises a die having a first surface and a second surface. The first surface has at least one opening therein, and the second surface comprises a pad formed thereon. The first surface is opposite to the second surface. A conductive layer is formed over the first surface, filling in the opening. The die is flip chip mounted to a package substrate with the second surface of the die facing the package substrate. An under-fill is between the die and the package substrate.

A method of forming a structure for heat dissipation includes forming an opening in a first surface of a die, which is opposite to an active surface of the die. A conductive layer is formed over the first surface, covering a surface of the opening.

The above and other features of the present invention will be better understood from the following detailed description of the preferred embodiments of the invention that is provided in connection with the accompanying drawings.

DETAILED DESCRIPTION OF THE INVENTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In the examples described below, openings (e.g., slots or holes) are formed in the inactive surface of a die. A conformal coating of a conductive material (e.g., metal) is formed in the openings, or a layer of the conductive material fills the openings and overlies the rear surface. The conformal coating or conductive fill material provides a built in heat spreader to distribute heat across the length and width of the die by conduction. The conformal coating also increases the surface area of the inactive surface of the die, acting as a built-in heat sink for dissipating heat into the ambient air by convection.

Figure 2A:
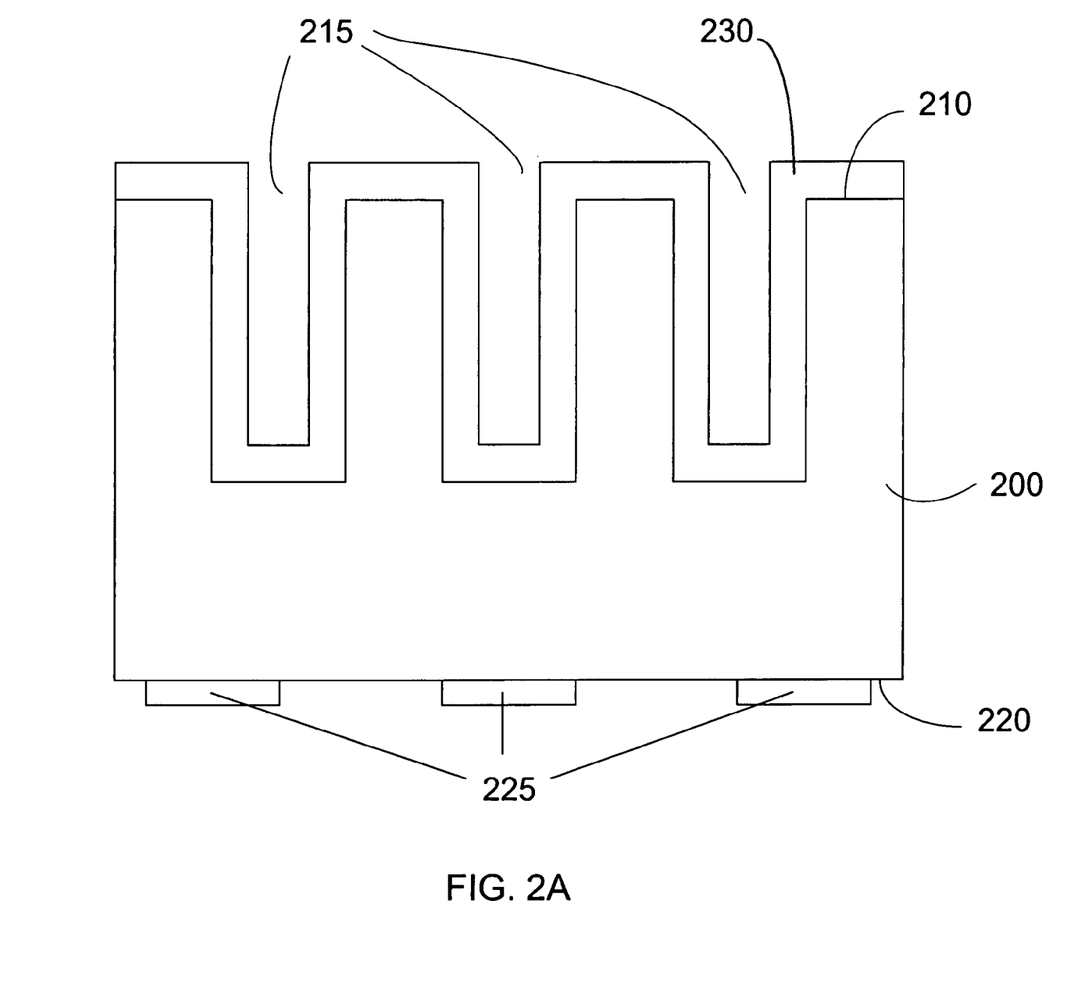
FIGS. 2A–2E are cross sectional views showing a method of forming a package structure for heat dissipation.
Figure 2B:
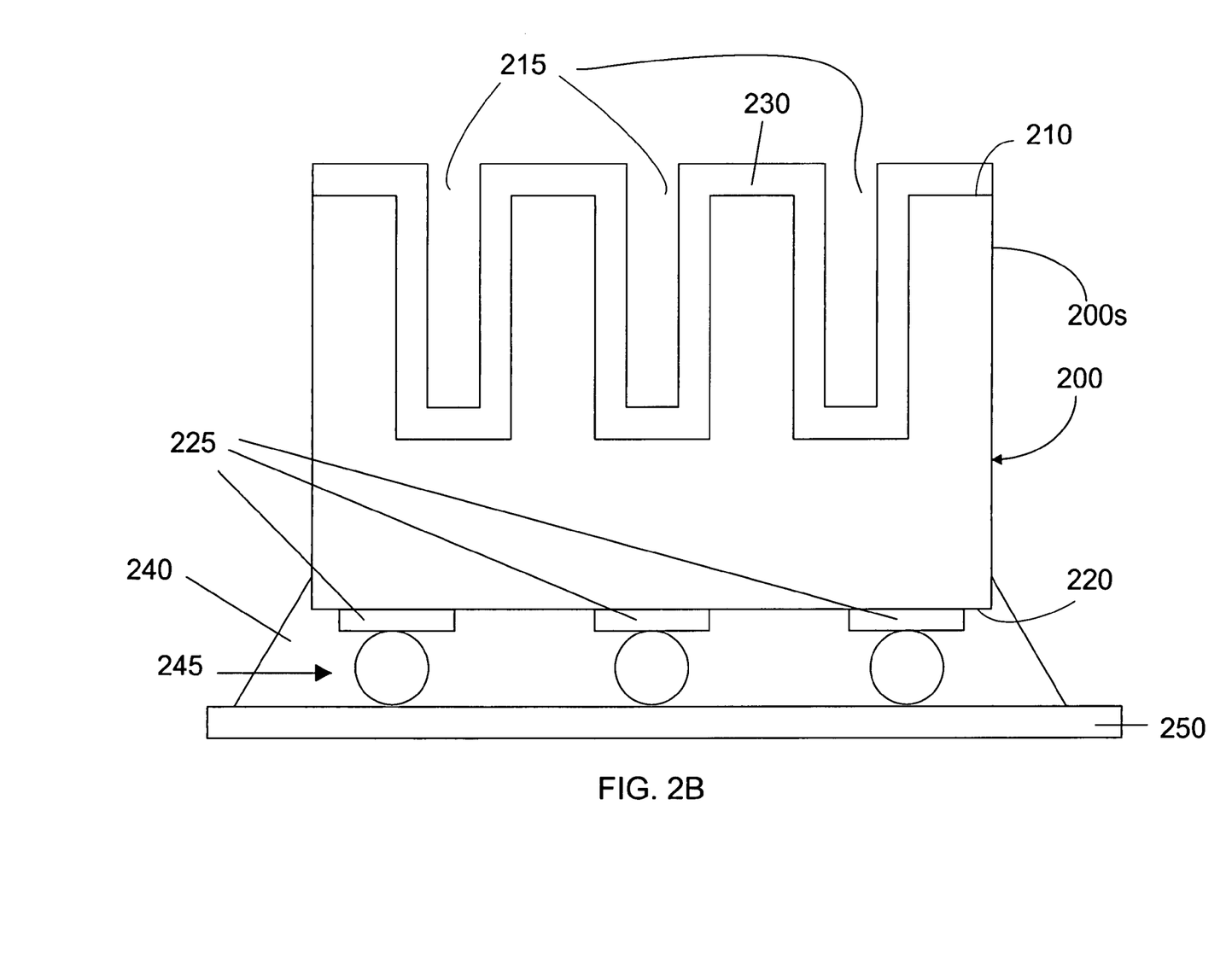
Figure 2C:
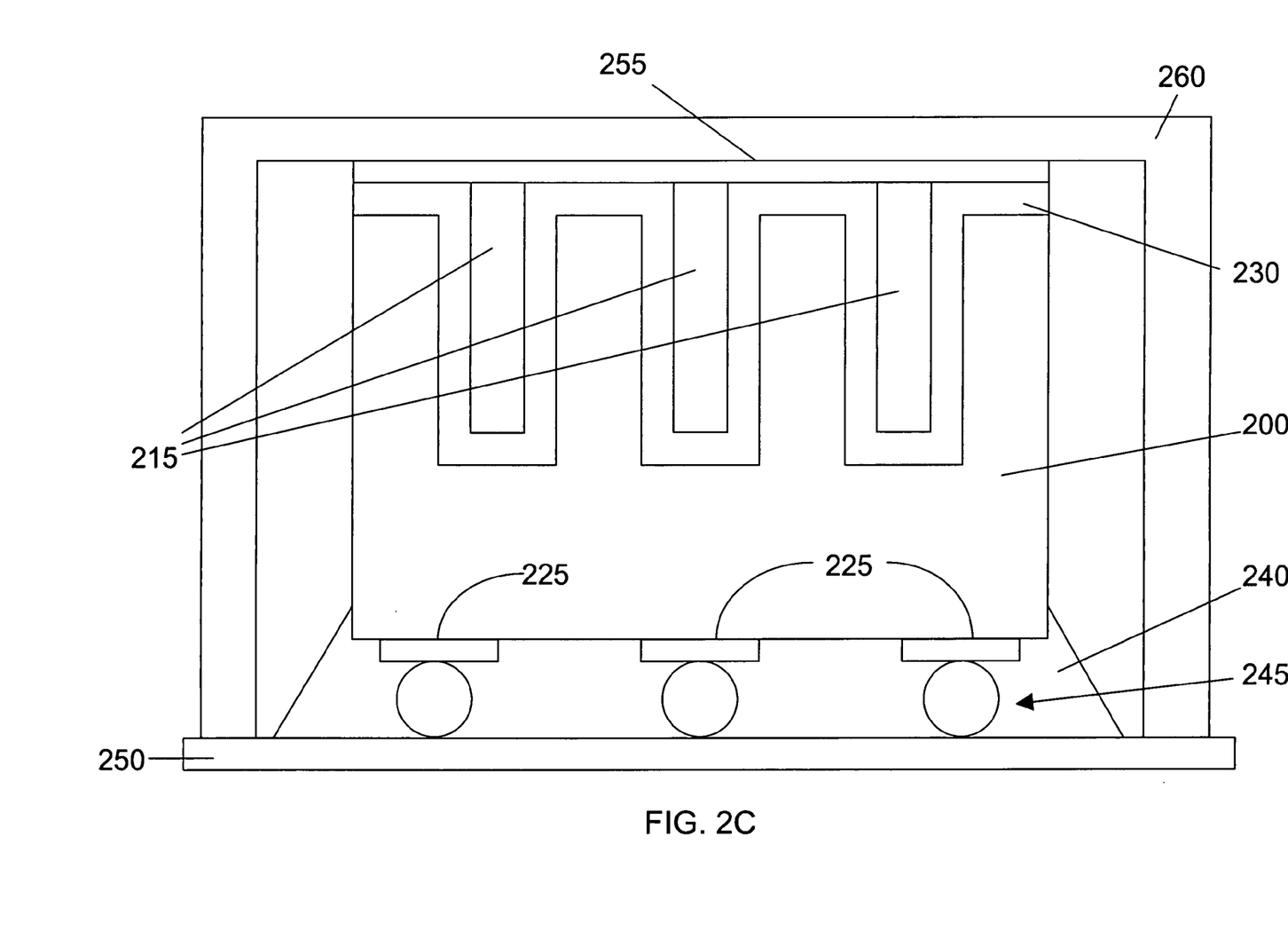

FIGS. 2A–2C are cross sectional views showing a method of forming a die structure and a package structure for heat dissipation.

Referring to FIG. 2A, a die 200 having a first (inactive) surface 210 and a second (active) surface 220 is provided. The inactive (first) surface 210 is opposite to the second (active) surface 220. Openings 215 are formed in the first surface 210. In some embodiments, the openings 215 are slots which extend across the length and/or width direction of the inactive (first) surface 210. The ridges or protuberances between the slots provide integral heat transfer fin structures. In other embodiments, the openings 215 may be a plurality of holes, such as cylindrical or rectangular prism-shaped holes. Conductive pads 225 are formed on the second surface 220. The pads 225 provide electrical connections between the circuitry within the die and the package substrate or circuit board (onto which the die 200 is mounted). In some embodiments, a conductive layer 230 is formed over the first surface 210, covering the openings 215. In this embodiment, the conductive layer is substantially conformal over the openings 215. With a conformal conductive layer 230, the openings 215 (i.e., slots or holes) still remain in the inactive surface of the die 200 after the conformal layer 230 is applied. Although FIG. 2A only shows three openings 215 and three pads 225, any desired number of openings 215 and any desired number of pads 225 may be used.

Referring to FIG. 2B, solder bumps 245 are formed on the pads 225 of the second (active) surface 220. The die 200 is flip-chip mounted to the substrate 250 with the solder bumps 245 forming mechanical and electrical connections. An under-fill 240 is filled between the substrate 250 and the first surface 220 of the die 200.

The substrate 250 can be, for example, a package substrate of a chip scale package (CSP), or a printed circuit board (PCB) onto which the die 200 is mounted using a chip on board (COB) process, or any other substrate which is adapted to support the die 200. The solder bumps 245 are preferably a nickel-gold material, but the bumps can be formed from a material such as gold, nick-gold, tin-lead solder, or any other metal which can serve as the electrical connection between the pads 225 and the package substrate 250. The under-fill 240 can be a material such as resin or the other material which is adapted to fill between the die 200 and the package substrate 250 so as to prevent delamination between the solder bumps and the die. In some embodiments, the configuration of FIG. 2B is a complete package; no external heat spreader or heat sink is used, and no encapsulant is applied over the inactive surface of the die. In this embodiment, the metal layer 230 provides protection for the inactive surface of the die. If desired, an encapsulant material may be applied on the side walls 200s of the die, for added protection, without interfering with the heat transfer properties of the conductive layer 230.

FIG. 2C shows a configuration, in which the substrate 250 is a package substrate of a package in which the die 200 is mounted. In FIG. 2C, the openings 215 are filled in, either with the same metal as the liner layer 230, or with another highly conductive material. Referring to FIG. 2C, a thermal interface material 255 is formed on the conductive layer 230 and the tops of the (now filled) openings 215. A heat spreader 260 interfaces to the package substrate 250 so as to cover the die 200, to spread the heat, and to conduct heat between the rear (inactive) surface of the die and the package substrate 250. A thermal interface material may also be used where the edge of the heat spreader meets the package substrate, to reduce the thermal resistance. In this configuration, the liner 230 and the conductive fill material in the openings 215 provide an enhanced conduction path for dissipating heat from the die 200. Essentially, the combination of the metal liner layer 230, the conductive fill in openings 215, the thermal interface material 255 and the heat spreader 260 act as a highly effective combined heat spreader, to provide a more even temperature distribution on the die 200.

The structure shown in FIG. 2C may be used with or without an external heat sink (not shown in FIG. 2C) to provide effective convection for heat removal from the die 200. Because the conductive material in the openings 215 provides additional thermal mass, the structure of FIG. 2C can absorb more heat than a structure without conductive material in the openings 215 (e.g., FIG. 2A) for any given temperature increase. Thus, this structure can allow the device to operate at the same peak temperature with a given power dissipation, or allow the device to operate at a lower peak temperature with a higher power dissipation. To enhance this aspect of the structure, conductive materials with a high specific heat are desirable.

The thermal interface material 255 can be a conductive material such as tin-lead solder, conductive epoxy, gold, gold-nickel, aluminum, aluminum-copper, copper or any other material which is adapted to adhere the metal layer 230 to the heat spreader 260, with low thermal resistance. The thermal interface material 255 can be formed on the metal layer 230 by PVD, CVD or a printing method. With good thermal conductive properties similar to those of the conductive layer 230 and the heat spreader 260, the solder layer 255 may prevent delamination. After reading the descriptions of this embodiment, one of ordinary skill in the art will understand that the thermal interface material 255 and the heat spreader 260 are optional and determine whether to add the thermal interface material 255 and the heat spreader 260.

Figure 2D:
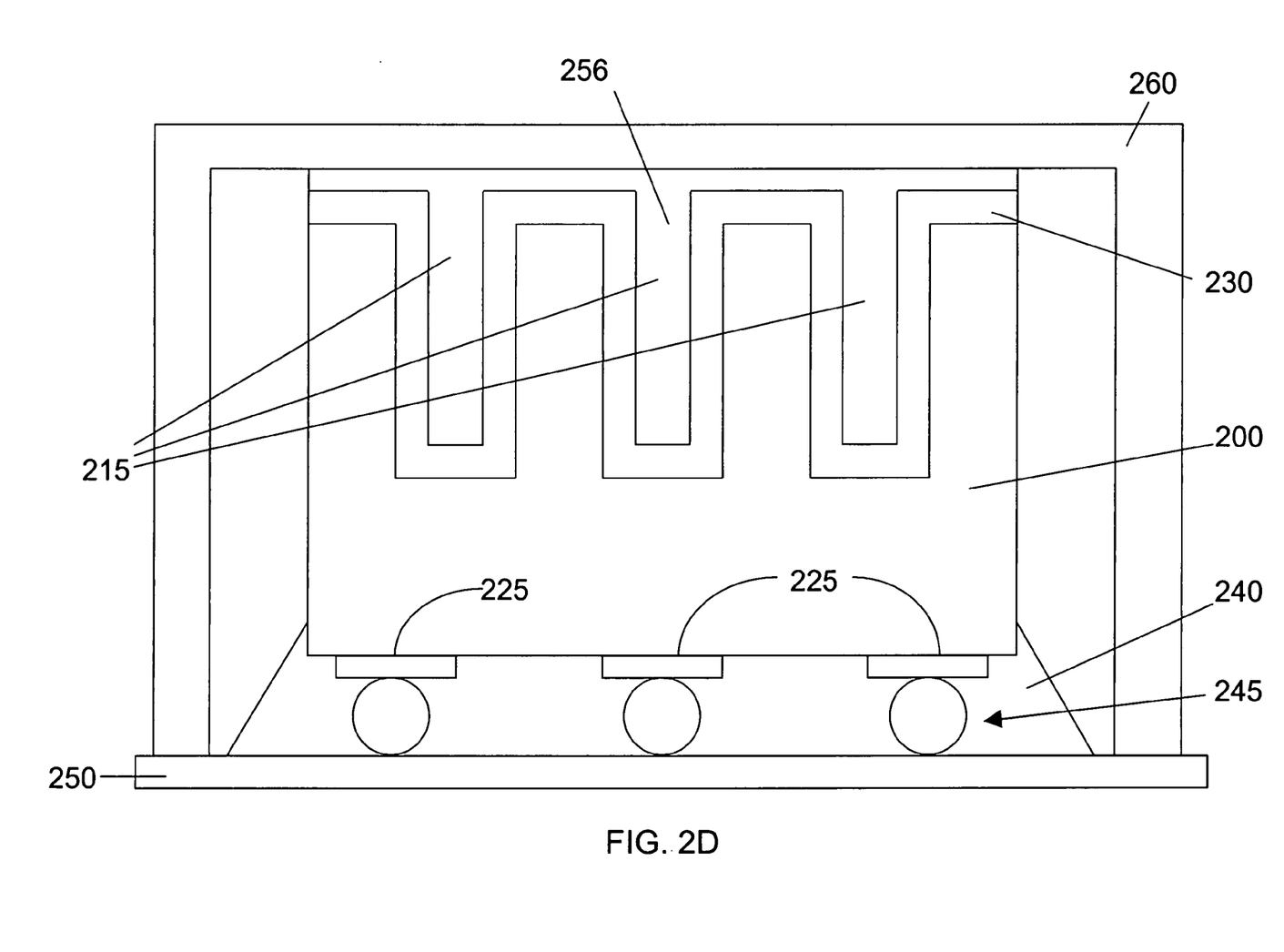
Figure 2E:
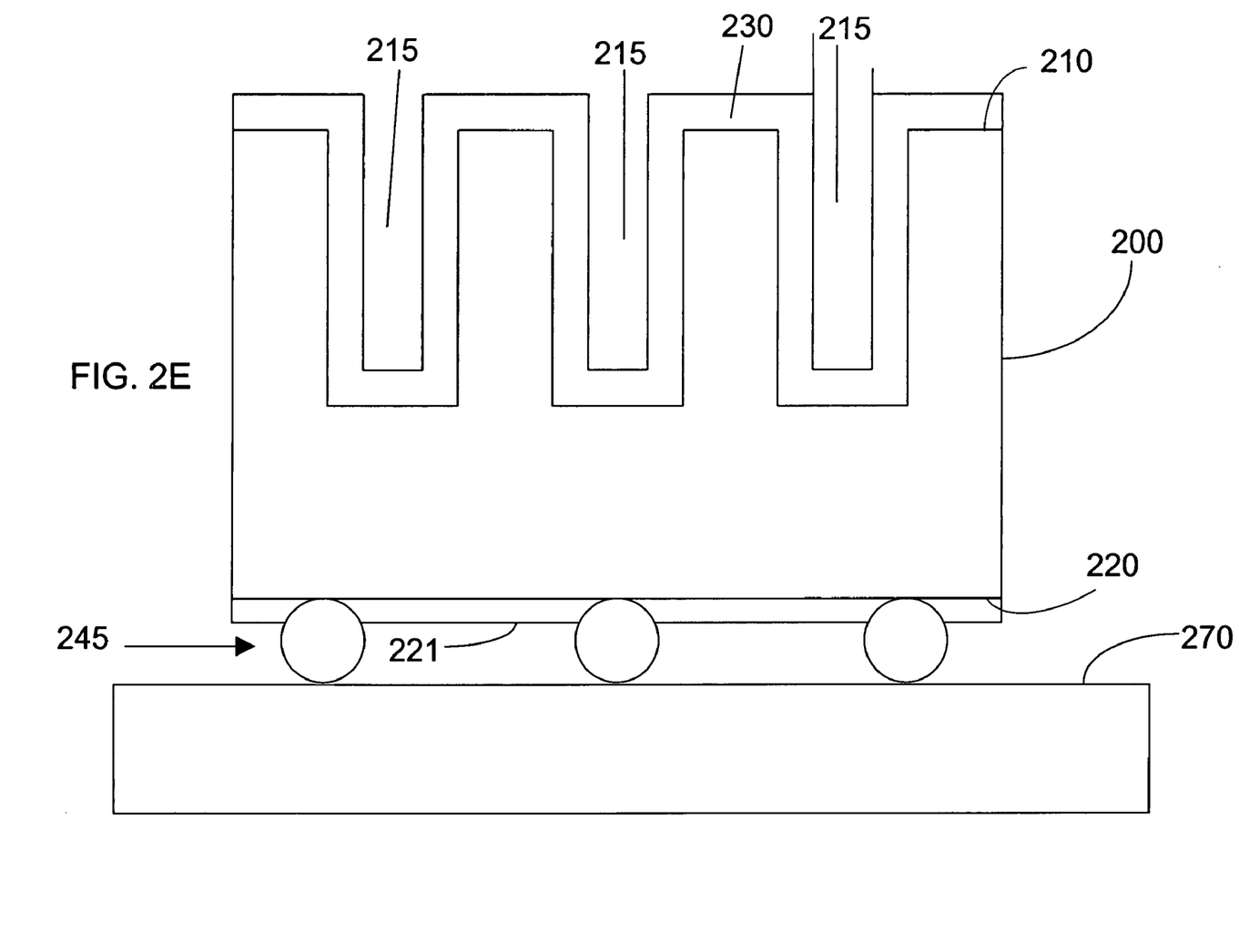

FIG. 2D is another variation of the structure shown in FIG. 2C. In FIG. 2D, items that are the same as those shown in FIG. 2D are indicated by like reference numerals, and a description of these items is not repeated. In FIG. 2E, instead of providing one step to fill the openings 215 with conductive material and a second step to apply the thermal interface material 255, a single step of applying the thermal interface material 256 may be used. The thermal interface material is used to fill the openings 215 and provide an interface between the liner 230 and the heat spreader 260. Any of the thermal interface materials described above may be used.

FIG. 2E shows another configuration in which the substrate 270 is a PCB, and the COB process is used. The PCB 270 may be any suitable material, such as FR-4. A glass or stress buffer layer 221 is applied on the active surface 220 of the die 200. The configuration of FIG. 2E is essentially complete for a COB configuration; it is not necessary to apply an encapsulant over the entire die 200. If desired, an encapsulant (not shown) can be applied to the unplated sides of the die 200, leaving the metal layer 230 exposed for enhanced heat transfer. The metal layer 230 provides protection for the die 200, so it is not necessary to apply an encapsulant over the inactive surface 210 of the die. Because the metal layer 230 provides a fin configuration, no external heat sink is required. Although only one die 200 is shown on the PCB 270, it is understood that the PCB 270 may contain any desired number of COB mounted dies, IC packages, printed circuitry, discrete devices, and the like thereon.

Figure 2F:
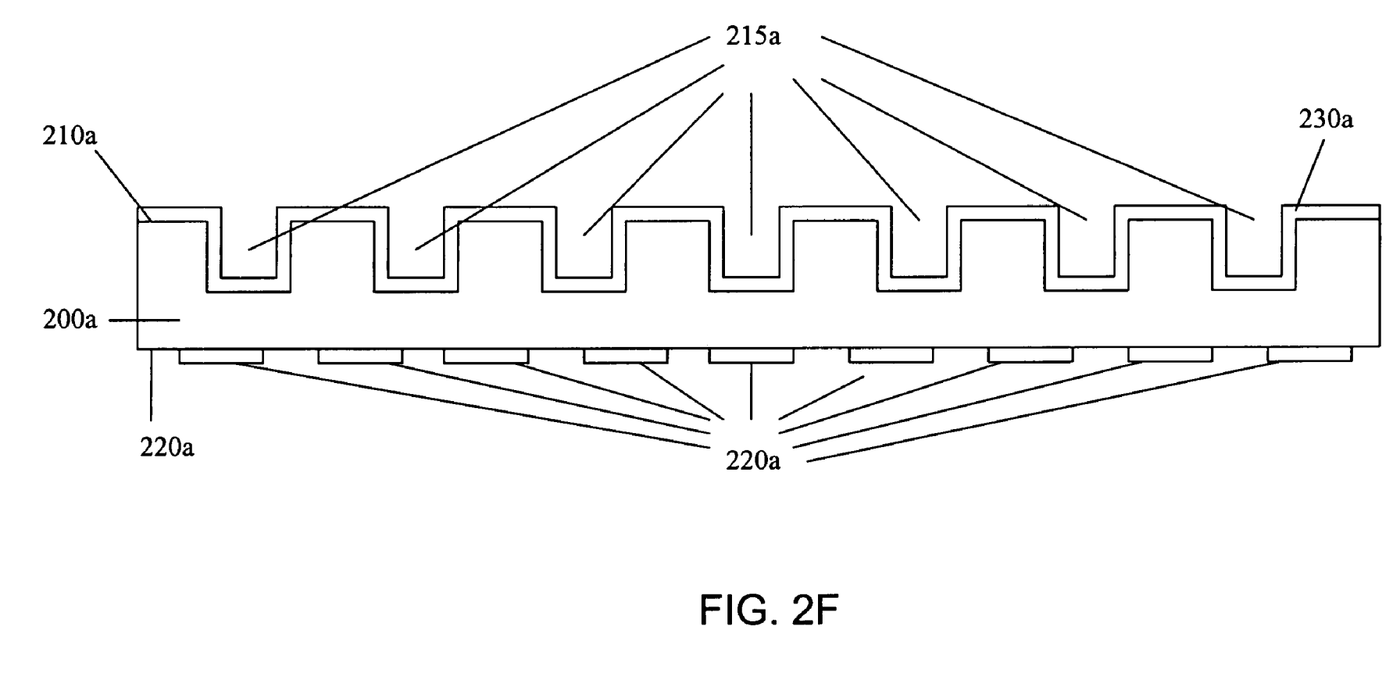
FIG. 2F is a cross sectional view showing a wafer structure for forming the die 200 shown in FIG. 2A.

FIG. 2F is a cross sectional view showing a wafer structure for forming the die 200 shown in FIG. 2A. A substrate 200a having a first (inactive) surface 210a and a second (active) surface 220a is provided. The first surface 210a is opposite to the second surface 220a. A plurality of openings 215a are formed in the first (inactive) surface 210a. The second (active) surface 220a has a plurality of conductive pads 225a for forming the electrical connections between the various dies and the package substrates or circuit boards onto which the die are mounted. A conductive material 230a is formed over the first surface 210a, covering the openings 215a. In some embodiments, the openings 215 are slots formed by the same dicing tool used to singulate the dies. Then, by dicing the wafer 200a, a plurality of dies 200 are thus formed.

The substrate 200a can be, for example, a silicon substrate, a III–V compound substrate, a glass substrate, a liquid crystal display (LCD) substrate or the other substrate similar to those described above. The pads 220a can be formed, for example, by depositing a metal layer (not shown) on the second surface 220a of the wafer 200a, and patterning the metal layer by a photolithographic process and an metal etch process so as to form the pads 220a, i.e. the pads 220 shown in FIG. 2A. The pads 220a can be a material such as aluminum, aluminum copper, copper or the other material that is adapted to be formed on a wafer for electrical conduction.

The openings 215a, i.e. the openings 215 shown in FIG. 2A, are formed in the first (inactive) surface 210a of the wafer 200a, for example, by a photolithographic process and an etch process. In some embodiments, before forming the openings 215a, the wafer is ground to a desired thickness. The grinding process is applied to the first (inactive) surface 210a of the wafer 200a. The grinding process is proper as long as the wafer 200a is not so thin that the subsequent dicing process will crack the wafer 200a. One of ordinary skill in the art, after reading the description of this embodiment, will understand how to control the thickness of the wafer 200a. The conductive material 230a, i.e. the conductive layer 230 shown in FIG. 2A, is then formed over the first surface 210a of the wafer 200a, covering the openings 215a. The conductive material 230a can be a material such as aluminum, aluminum copper, copper, gold, nickel-gold or the other material that is adapted to transmit heat. The conductive material 230a can be formed by electroless plating, physical vapor deposition (PVD) or chemical vapor deposition (CVD). In some embodiments, the conductive layer 230a comprises a nickel-gold alloy. The wafer 200a is then diced into a plurality of dies, for example, by a laser dicing process. In some embodiments, the structure shown in FIG. 2A can be formed by directly forming the openings 215, the pads 225 and the metal layer 230 on the die 200 without being formed on a wafer before dicing.

Figure 3A:
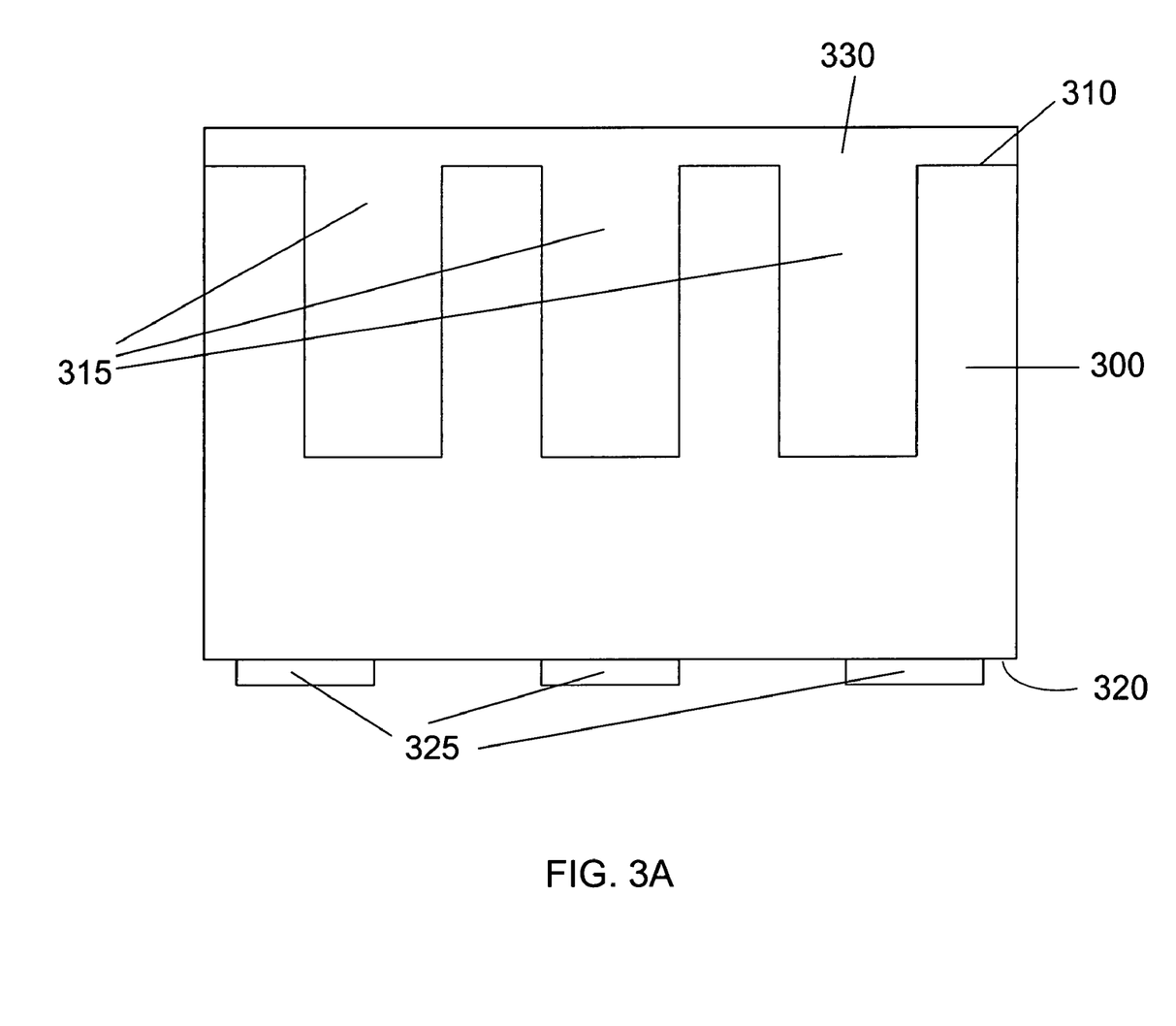
FIGS. 3A–3C are cross sectional views showing another method of forming a package structure for heat dissipation.
Figure 3B:
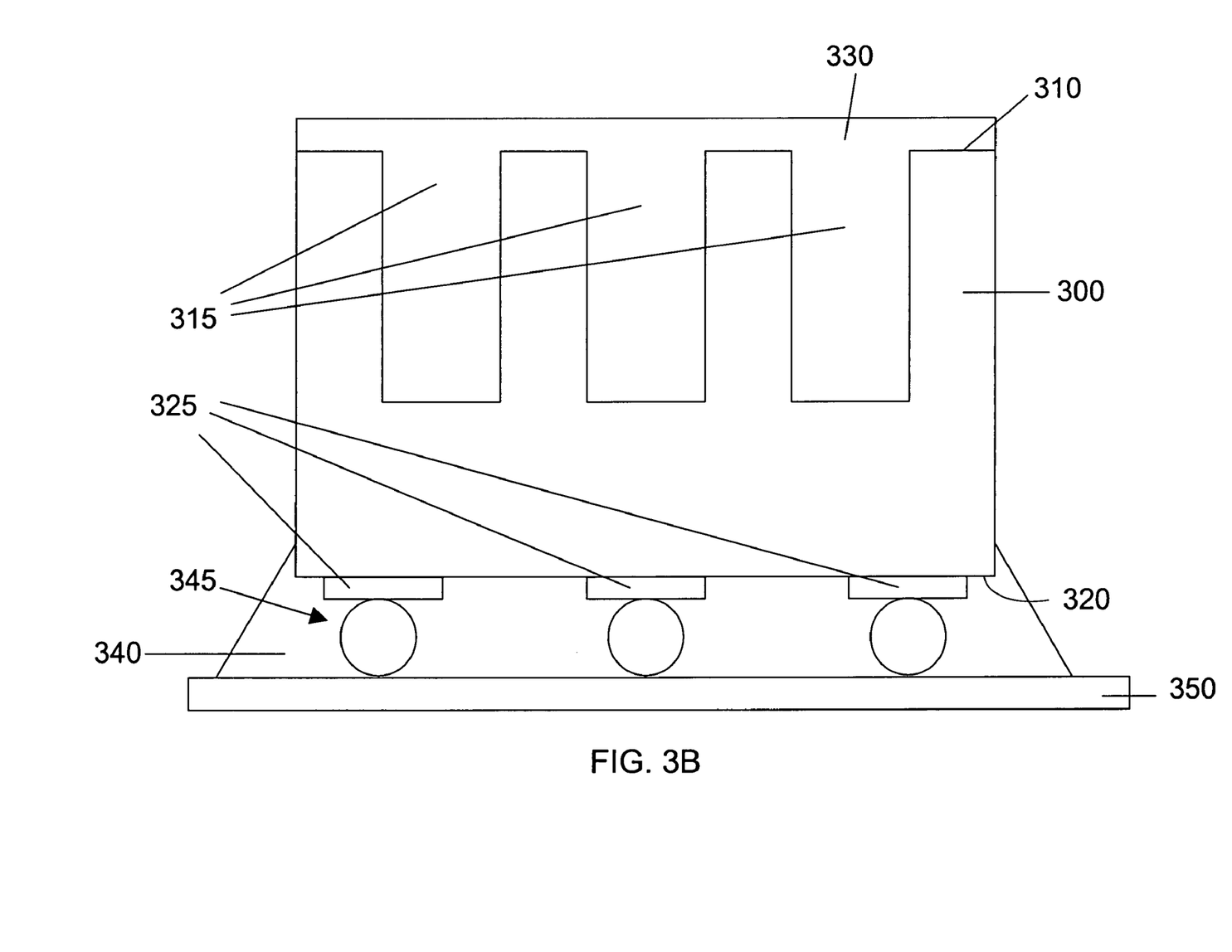
Figure 3C:
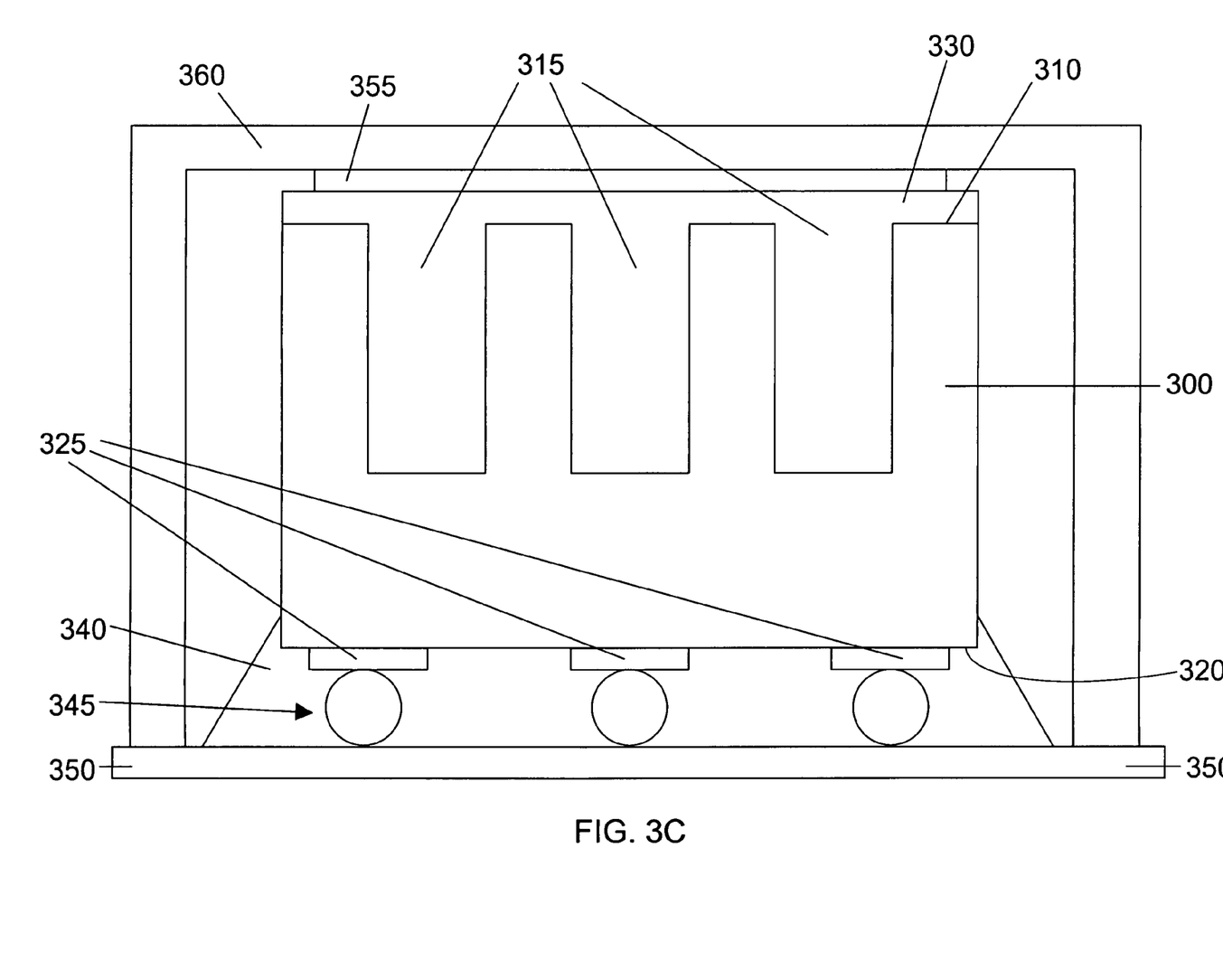

FIGS. 3A–3C are cross sectional views showing another variation of the method of forming a package structure for heat dissipation.

Referring to FIG. 3A, a die 300 having a first (inactive) surface 310 and a second (active) surface 320 is provided. The first surface 310 is opposite the second surface 320. Openings 315 are formed in the first surface 310. Pads 325 are formed on the second surface 320. A conductive layer 330 is formed over the first surface 310, filling and covering the openings 315. In this embodiment, the conductive layer fully fills the openings 315. Functionally, this conductive layer is similar to the filled-in liner 230 of FIGS. 2C and 2D described above. The conductive layer 330 which fills in the openings in the inactive surface 310 provides an enhanced thermal conduction path, to provide excellent uniformity of temperature across the length and/or width of the die 300. Because a single material is sued to fill the openings 315 and form a covering layer thereover, a processing step can be saved. As in the case of the structure of FIGS. 2C and 2D, the conductive material 330 provides more thermal mass than the conformal liner of FIG. 2A, so a reduced peak temperature is possible, or a higher power dissipation is possible with the same peak temperature.

The method of the die 300 may be with the same or similar to that described with the reference to FIG. 2A. Detailed descriptions are not repeated.

FIG. 3B shows a flip chip package including the die of FIG. 3A. Referring to FIG. 3B, solder bumps 345 are formed on the pads 325 of the second (active) surface 320. The die 300 can then be flip-chip mounted to a package substrate 350 using the solder bumps 345. An under-fill 340 is applied between the package substrate 350 and the first (active) surface 320 of the die 300. The solder bumps 345, the package substrate 350 and the under-fill 340 may be with the same or similar to those described with the reference to FIG. 2B. Detailed descriptions are not repeated.

Referring to FIG. 3C, a thermal interface material layer 355 is formed on the conductive layer 330 and a heat spreader 360 is conductively coupled with the conductive layer and the package substrate 350 so as to cover the die 300. The thermal interface material layer 355 and the heat spreader 360 may be with the same or similar to those described with reference to FIG. 2C. Detailed descriptions are not repeated. As described in FIG. 3C, the thermal interface material layer 355 and the heat spreader 360 are not necessarily required. So long as the structure shown in FIG.

3B is effective to dissipate the expected heat from the die 300, the thermal interface material layer 355 and the heat spreader 360 can be omitted.

Figure 4A:
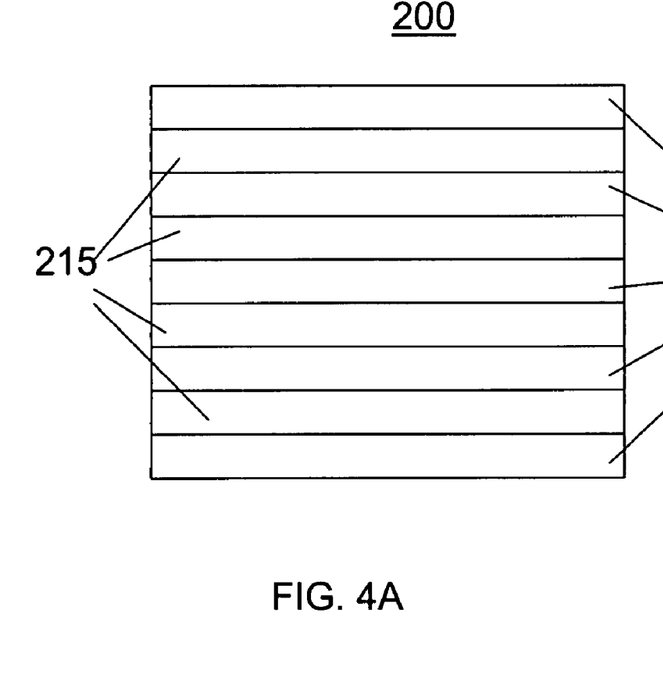
FIG. 4A is an example of a bottom plan views of the die shown in FIG. 2A.
Figure 4B:
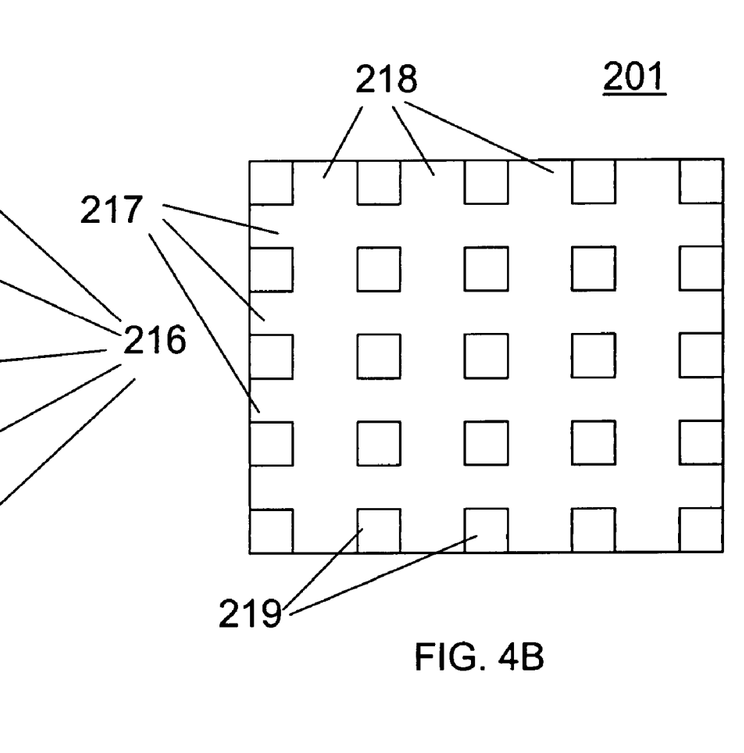
FIG. 4B is an alternative example of a bottom plan view of the die shown in FIG. 2A.

FIGS. 4A and 4B are bottom plan views of the die 200 show two alternative patterns for the openings of the die 200. In FIG. 4A, a plurality of horizontal slots 215 are provided in the inactive surface of the die 200, with a plurality of ridges or lands 216 between successive slots. The ridges 216 act as heat transfer fins. In FIG. 4B, a plurality of horizontal slots 217 and a plurality of vertical slots 218 are provided in the inactive surface of the die 201. This configuration forms a plurality of rectangular prism shaped protuberances 219, which act as heat transfer fins. Other configurations are also possible. As noted above, the openings may be formed as rectangular or cylindrical holes (for example, by etching), so that the interior surface of the holes provides the heat transfer surface.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A structure for heat dissipation, comprising:
   a die having a first surface and a second surface, the first surface comprising at least two openings therein, the second surface comprising a contact pad formed thereon, the first surface being opposite to the second surface; and
   a conductive layer formed over the first surface, the conductive layer covering a surface of the at least two openings and covering a portion of the first surface that connects the at least two openings.

2. The structure of claim 1, wherein the conductive layer is substantially conformal over the respective surface of the openings.

3. The structure of claim 1, wherein the conductive layer fills the openings.

4. The structure of claim 1, further comprising a solder bump on the contact pad of the second surface of the die.

5. The structure of claim 4, further comprising:
   a package substrate, the die being flip-chip mounted to the package substrate, and
   an under-fill between the package substrate and the second surface of the die.

6. The structure of claim 4, further comprising:
   a printed circuit board, the die being mounted to the printed circuit board by a flip-chip process, and
   an under-fill between the printed circuit board and the second surface of the die.

7. The structure of claim 1, further comprising:
   a package substrate to which the die is mounted by a flip-chip process, with the second surface of the die facing the package substrate; and
   an under-fill between the die and the package substrate.

8. A structure, comprising:
   a die having a first surface and a second surface, the first surface comprising at least one opening therein, the second surface comprising a contact pad formed thereon, the first surface being opposite to the second surface;
   a conductive layer formed over the first surface, covering a surface of the opening;
   a solder bump on the contact pad of the second surface of the die;
   a package substrate, the die being flip-chip mounted to the package substrate;
   an under-fill between the package substrate and the second surface of the die; and
   a thermal interface material layer on the conductive layer and a heat spreader.

9. A structure, comprising:
   a die having a first surface and a second surface, the first surface comprising at least one opening therein, the second surface comprising a contact pad formed thereon, the first surface being opposite to the second surface; and
   a conductive layer formed over the first surface, covering a surface of the opening,
   wherein the first surface has a plurality of slots therein with ridges formed between the slots, and the conductive layer is a substantially conformal over the slots and ridges, thereby forming a heat sink structure on the first surface.

10. The structure of claim 9, wherein the plurality of slots include first slots in a first direction and second slots in a second direction substantially perpendicular to the first direction.

11. A method of forming a structure for heat dissipation, comprising:
    forming at least two openings in a first surface of a die, which is opposite to an active surface of the die; and
    forming a conductive layer over the first surface, the conductive layer covering a respective surface of at least two adjacent openings and covering a portion of the first surface that connects the at least two adjacent openings.

12. The method of claim 11, wherein the conductive layer is substantially conformal over the respective surface of the openings.

13. The method of claim 11, wherein the conductive layer fills the openings.

14. The method of claim 11, wherein the step of forming the openings comprises:
    forming a plurality of openings on the first surface of a wafer; and
    forming a layer of conductive material over the first surface of the wafer; and
    dicing the wafer.

15. The method of claim 14, further comprising grinding the first surface of the wafer.

16. The method of claim 11, further comprising forming at least one solder bump on at least one pad of the active surface of the die.

17. The method of claim 16, further comprising mounting the solder bump to a package substrate and filling an under-fill between the package substrate and the die.

18. The method of claim 11, wherein the opening forming step includes forming a plurality of slots in the first surface of the die.

19. The method of claim 18, wherein the slots are formed using a dicing apparatus.

20. A method, comprising:
    forming an opening in a first surface of a die, which is opposite to an active surface of the die;
    forming a conductive layer over the first surface, covering a surface of the opening;

forming at least one solder bump on at least one pad of the active surface of the die;

mounting the solder bump to a package substrate and filling an under-fill between the package substrate and the die; and forming a layer of a thermal interface material on the conductive layer and mounting a heat spreader thereto.

21. A structure for heat dissipation, comprising:

a first die having a first surface and a second surface, the first surface comprising at least one opening therein, the second surface comprising a contact pad formed thereon, the first surface being opposite to the second surface; and a conductive layer formed over the first surface, covering a surface of the opening, the conductive layer covering the first surface and the surface of the opening, wherein the conductive layer has a surface area larger than an area of a backside surface of a second die having the same length and width as the first die, and wherein the backside surface of the second die has no opening.

* * * * *

UNITED STATES PATENT AND TRADEMARK OFFICE
CERTIFICATE OF CORRECTION

| | | |
|---|---|---|
| PATENT NO. | : 7,112,882 B2 | |
| APPLICATION NO. | : 10/925612 | |
| DATED | : September 26, 2006 | |
| INVENTOR(S) | : Hsin-Hui Lee | |

It is certified that error appears in the above-identified patent and that said Letters Patent is hereby corrected as shown below:

On the title page, item [56] Foreign Patent Documents, "TW 29112 4/2003" should be changed to --TW 529112 4/2003--.

Signed and Sealed this
Twenty-first Day of February, 2012

David J. Kappos
*Director of the United States Patent and Trademark Office*